United States Patent [19]

Yukami et al.

[11] Patent Number: 4,920,394
[45] Date of Patent: Apr. 24, 1990

[54] PHOTO-SENSING DEVICE WITH S-SHAPED RESPONSE CURVE

[75] Inventors: Noboru Yukami; Mitsusuke Ikeda, both of Hirakata; Masaharu Ohno, Higashiosaka; Mikihiko Nisihtani, Nara, all of Japan

[73] Assignee: Matsushita Electric Industrial Co., Ltd., Kodama, Japan

[21] Appl. No.: 191,783

[22] Filed: May 4, 1988

Related U.S. Application Data

[63] Continuation of Ser. No. 768,842, Aug. 23, 1985, abandoned.

[30] Foreign Application Priority Data

Aug. 31, 1984 [JP] Japan ................. 59-181751

[51] Int. Cl.⁵ ............................................. H01L 27/14
[52] U.S. Cl. ........................................ 357/30; 357/63; 357/61
[58] Field of Search ................ 357/63, 30 B, 30 L, 357/30 F, 30 R, 30 M, 61, 64

[56] References Cited

U.S. PATENT DOCUMENTS

| | | | |
|---|---|---|---|
| 2,651,700 | 9/1953 | Gans | 357/30 B |
| 2,765,385 | 10/1956 | Thomsen | 357/30 B |
| 3,225,273 | 12/1965 | Bakker et al. | 357/30 B X |
| 3,443,103 | 5/1969 | Lakshmanan | 357/30 B X |
| 3,447,234 | 6/1969 | Reynolds et al. | 357/30 B X |
| 3,602,721 | 8/1971 | Nakamura et al. | 357/30 B X |
| 3,864,721 | 2/1975 | Cohen | 357/63 X |
| 3,975,306 | 8/1976 | Jones et al. | 357/30 B X |
| 4,323,617 | 4/1982 | Mandai et al. | 357/61 X |

FOREIGN PATENT DOCUMENTS

| | | | |
|---|---|---|---|
| 53-64490 | 6/1978 | Japan | 357/61 |
| 54-134994 | 10/1979 | Japan | 357/61 |
| 57-101471 | 6/1982 | Japan | . |
| 57198967 | 5/1984 | Japan | 357/30 B |
| 60-66479 | 4/1985 | Japan | 357/30 B |
| 61-84860 | 4/1986 | Japan | 357/30 L |

OTHER PUBLICATIONS

Yukami et al., "High-Speed $CdS_{0.2}Se_{0.8}$ Photoconductor and Its Application to Line-Image Sensors," *IEEE Transactions Electron Devices*, vol. ED-33, No. 4, Apr., 1986, 520–25.

Bube, "Photoconductivity Speed of Response for High Intensity Excitation in Cadmium Sulfide and Selenide", *Journal of Applied Physics*, vol. 27, No. 10, Oct. 1956, pp. 1237–1242.

Porada et al., "Influence of the Aging Process on the Photoconducting Properties of CdS(Cu,Cl) Thin Films", *Thin Solid Films*, 110, (1983), pp. 1–5.

Bube, *Photoconductivity of Solids*, John Wiley & Sons, New York, 1960, pp. 272–325.

Bube et al., "Properties of Cadmium Sulfide Crystals with High Impurity Concentrations", *Physical Review*, vol. 128, No. 2, Oct. 13, 1962, pp. 532–539.

*Primary Examiner*—William Mintel
*Attorney, Agent, or Firm*—Cushman, Darby & Cushman

[57] ABSTRACT

When a photocurrent is detected by irradiating a main light reflected on a manuscript and a biasing light, on a photo-sensing device, the material of the photo-sensing device of the present invention has a response characteristic of a photocurrent to time, a rise characteristic of the response characteristic being S-shaped, and thereby to obtain a superior response characteristic of the photo-sensing device.

6 Claims, 8 Drawing Sheets

F I G. 4
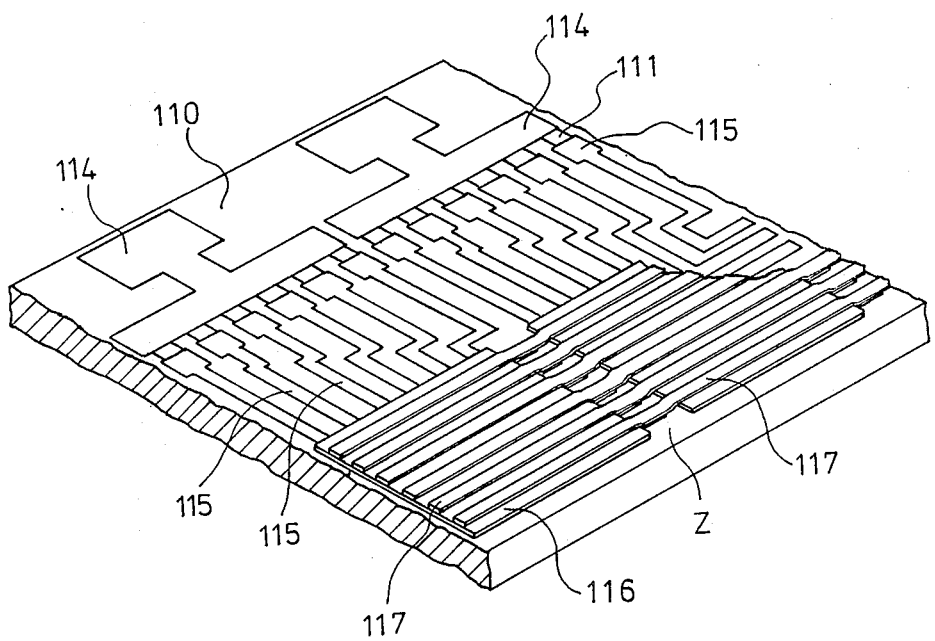

PHOTO-SENSING DEVICE WITH S-SHAPED RESPONSE CURVE

This is a continuation of application Ser. No. 768,842, filed Aug. 23, 1985, which was abandoned upon the filing hereof.

FIELD OF THE INVENTION AND RELATED ART STATEMENT

1. Field of the Invention

The present invention relates generally to a photo-sensing device, and particularly to a contact and line type photo-sensing device suitable for use in various electronic apparatuses in offices, for example, a facsimile machine, a duplicator and an optical disk system.

2. Description of the Related Art

Recently, an image reading apparatus is utilized that includes a contact and line type photo-sensing device which has the same page size as the manuscript which is to be copied in order to miniaturize the image reading apparatus of the facsimile machine etc. and to reduce image distortion. With regard to the image reading apparatus, an improvement of the response speed of the photo-sensing device is strongly desired so as to correspond to the high-speed of information transmission, since the response speed determines the reading velocity.

The standard construction of conventional image reading apparatus using the contact and line type photo-sensing device, which has the same dimension as the manuscript, has a photo-sensing device to which a reflected light from the manuscript is projected through a condensor of a focusing fiber array etc.

A method for improving such conventional image reading apparatus by irradiating a biasing light directly on the photo-sensing device, is known as in a Japanese unexamined published patent application No. Sho-57-101471. Such a method utilizing the biasing light and the superior effect to improvement of the response speed caused by the direct irradiated biasing light, is described in Photoconductivity of Solids by R. H. Bube, John Wiley & Sons, N.W., 1960, p. 285", which was published prior to the publication of the Japanese unexamined published patent application No. Sho 57-101471.

Therefore, a construction in which the biasing light is irradiated directly onto a photo-sensing device in addition to the reflected light from the manuscript, is already known.

A CdS-CdSe solid solution, amorphous Si, and a CCD utilizing a Si single crystal are disclosed as the photo-sensing element array forming the contact and line type photo-sensing device.

The response characteristic of a photocurrent to time, of these photo-sensing devices generally shows an exponential function type increase (See Journal of Applied Physics Vol. 27, No. 10, Oct. 1956, p. 1237–1242, Thin Solid Films, 110 (1983) 1-5 ELECTRONIC AND OPTICS).

Though it is known that a biasing light can improve the photoresponse speed, it is not known at all what kind of material for the photo-sensing device can show the most superior photoresponse characteristic. For example, the improvement of the response speed caused by the biasing light is small with regard to the above-mentioned photo-sensing device having an exponential function type increase. The contact and line type photo-sensing device using a CdS-CdSe solid solution as the photo-sensing device has various advantages such that a large photocurrent is obtainable and the design of a circuit can be executed easily, and so on. But the response speed of the photo-sensing device is inferior. The scanning velocity of the contact and line type photo-sensing device is 10 to 20 msec/line under 100 lux of light irradiation when the contact and line type is 1728 bits type for use in A4 sheet size. Improvement of the scanning velocity is required.

SUMMARY OF THE INVENTION

A first object of the present invention is to offer a photo-sensing device having a very high response speed.

A second object of the present invention is to offer an image sensing apparatus which can read a manuscript quickly by utilizing the above-mentioned photo-sensing device.

These objects are accomplished by the following construction.

A photo-sensing device for detecting light under application of biasing light, in accordance with the present invention comprises:

a photo-electric transducing element of a material having a given response characteristic of a photocurrent to time, the characteristic shape of the rise of the response characteristic being an S shape.

Furthermore, an image sensing apparatus in accordance with the present invention comprises:

a main frame, a substrate fixed to the main frame, a photo-sensing device formed on the substrate, the photo-sensing device comprising a material having a given response characteristic of light current to time, the characteristic shape of the response characteristic being an S shape, a main light source fixed to the main frame, a rod lens fixed to the main frame, for focusing a light reflected from a manuscript irradiated by light which is emitted from the main light source, on the photosensing device, a biasing light source fixed to the main frame, for irradiating the biasing light directly onto the photo-sensing device, and the photocurrent being detected from the photo-sensing device irradiated by the main light which is reflected on the manuscript and further irradiated directly by the biasing light.

While the novel features of the invention are set forth with particularity in the appended claims, the invention, both as to organization and content, will be better understood and appreciated, along with other objects and features thereof, from the following detailed description taken in conjunction with the drawings.

BRIEF DESCRIPTION OF THE DRAWINGS

FIG. 4 is a perspective view showing the photo-sensing device of the present invention;

DESCRIPTION OF THE PREFERRED EMBODIMENTS

The present invention is based on such a finding that a response speed is increased largely when the light current of a photo-sensing device having an S shaped rise characteristic is detected, with irradiating a biasing light onto the photo-sensing device.

In case of such photo-sensing device, the response speed is larger than the case when the conventional photo-sensing device having an exponential function type characteristic is irradiated by the biasing light.

Figure 1:
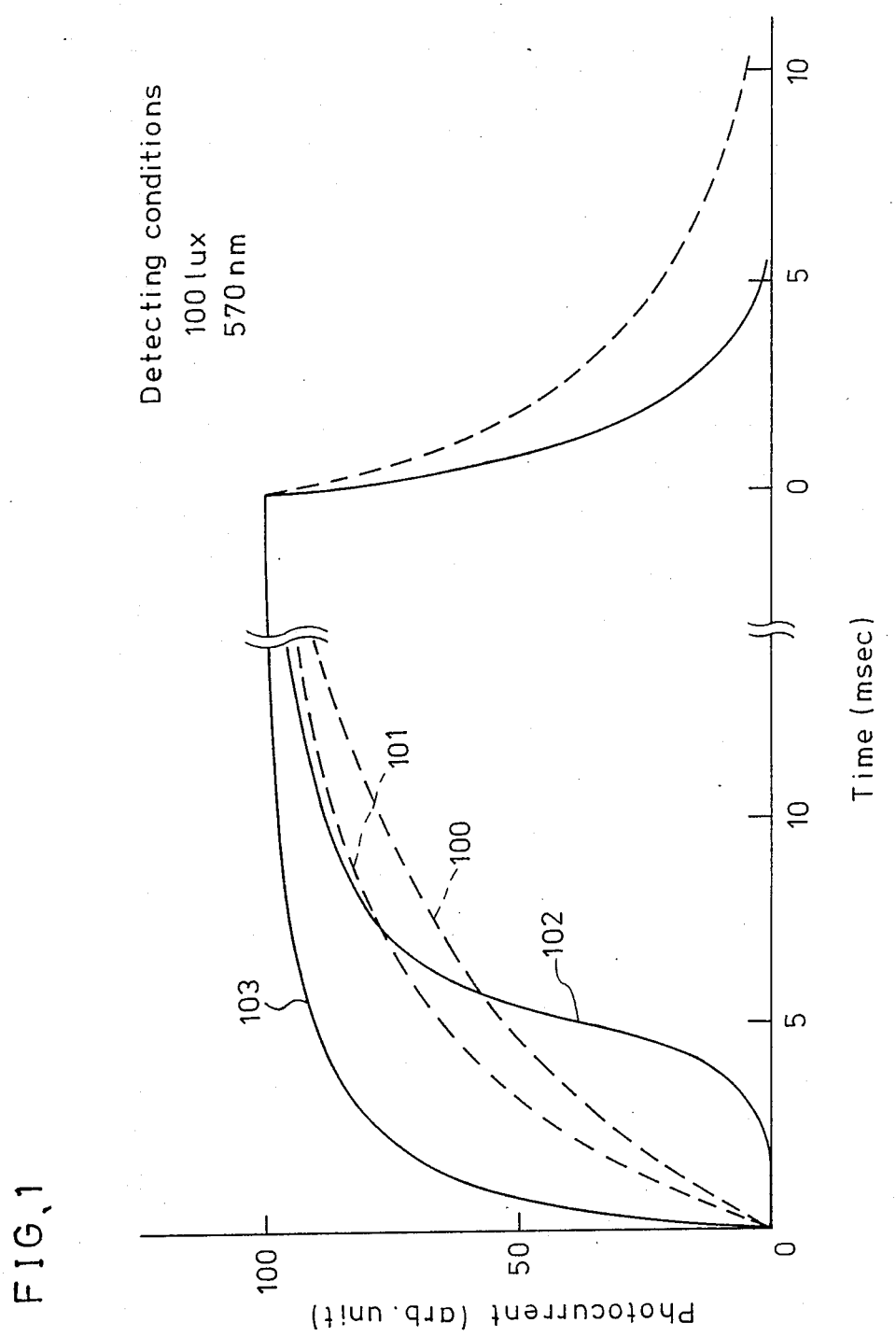
FIG. 1 is a diagram showing a characteristic of a photoresponse of a photo-sensing device of the present invention and a characteristic of a photoresponse of the conventional photo-sensing device.

A comparison between the characteristics of the photo-sensing device of the present invention and the characteristic of the conventional photo-sensing device is shown in FIG. 1. A main light having a wavelength of 570 nm and an intensity of 100 lux and a biasing light having 40 lux are used. Curves 100 and 101 indicate response characteristics of a photocurrent to time in the conventional photo-sensing device. Both photocurrent speeds are increased with the exponential function curve. The curve 100 indicates the characteristic with no biasing light. The curve 101 indicates the characteristic with the biasing light.

Curves 102 and 103 indicate response characteristics of a photocurrent to time in the photo-sensing device of the present invention. The curve 102 indicates the characteristic with no biasing light and is S-shaped. The curve 103 indicates the characteristic with the biasing light. The characteristic of the curve 103 indicates a higher response speed than that of the characteristic of the curve 101 of the conventional photo-sensing device.

Figure 2:
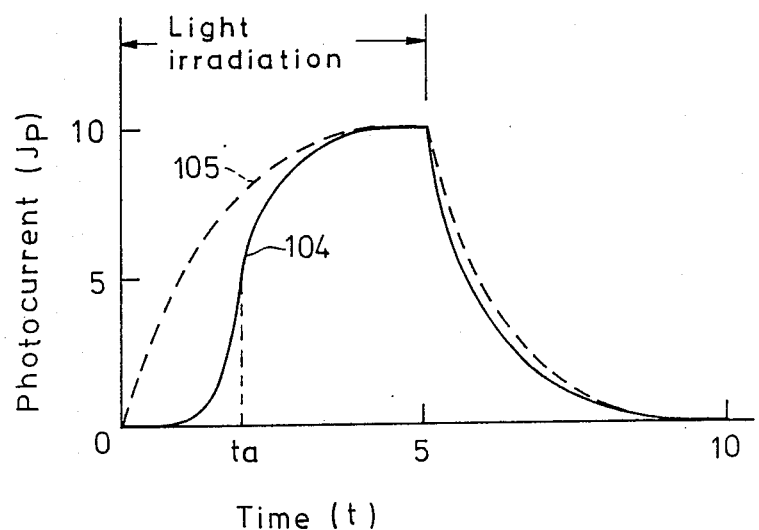
FIG. 2 is a diagram showing a rise characteristic of the photoresponse, having an exponential function type increase and a rise characteristic of the photoresponse, which is S-Shaped.

Incidentally, the S-shaped curve means that the increase of the photocurrent Jp to time t, namely, a differential coefficient $dJp/dt$ has a maximum value at $t=ta$ ($>0$) as shown by a curve 104 in FIG. 2. On the contrary, a broken curve 105 which corresponds to a conventional characteristic has a maximum value of $dJp/dt$ at $t=0$.

A photo-sensing device of any material can be used as the photo-sensing device of the present invention so long as the photo-sensing device has a photocurrent rise characteristic of S-shape. Further, a photo-sensing device of a material of II-VI compound semiconductor is preferable among the many characteristic S-shaped having photo-sensing devices, since the photocurrent is large and it is easy to deal with. Particularly, a photo-sensing device of a CdS-CdSe solid solution is preferable among the photo-sensing devices of the II-VI compound semiconductors, since the photocurrent is very large and the sensitivity of the photo-sensing device can be valid over the whole range of visible light. Further, a CdS-CdSe solid solution having 40 mol % or more of the CdSe in a CdS-CdSe solid solution is preferable since the advantage of the biasing light irradiation is particularly large.

With regard to the photo-sensing device of II-VI a compound semiconductor, particularly, CdS-CdSe solid solution, the response characteristic of the light current, namely, the largeness of the photocurrent, the shortness of the response time of a rise time or a fall time etc. are influenced by an impurity of Cl or Cu. In case of the CdS-CdSe solid solution, the higher the concentration of Cu becomes, the shorter the falling time of the light current becomes but the larger the rising time of the light current becomes.

The biasing light effect is obtainable when the relative intensity of the biasing light is 5 or more, the maximum value (corresponding to the white ground of the manuscript) of the intensity of the main light being defined as 100. The main light is reflected on the manuscript and reaches the photo-sensing device through a light condensor. Particularly, the biasing light effect becomes large when the intensity of the biasing light is 10 or more. The larger the intensity of the biasing light becomes, for example, 20 or 30, the higher the response speed, particularly, the shorter the rise time becomes. The response time becomes short even though the intensity of the biasing light becomes over 100. But the relative intensity of the biasing light is preferably within 100 on account of an electric signal processing procedure.

Further, the response time can be shortened by making the voltage applied to the photo-sensing device higher. That is, the photocurrent shows a saturation phenomenon when the applied voltage is made higher and higher. And when a voltage of 60% or more of the saturation voltage is applied, the response time is shortened.

As described above, the biasing signal caused by the biasing light which is irradiated directly onto the photo-sensing device, is superposed on the main signal caused by the indirect main light which is reflected on the manuscript. Therefore, a circuit for cancelling the current component caused by the biasing light, is needed.

Further, a more detailed description of the preferred embodiment is provided as follows.

FIG. 3(a), FIG. 3(b), FIG. 3(c), and FIG. 3(d) show successive stages in a process for making the photo-sensing device of the present invention.

Figure 3A:
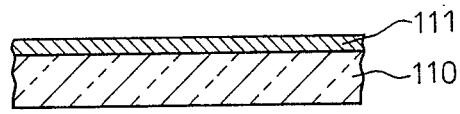
FIG. 3(a), FIG. 3(b), FIG. 3(c) and FIG. 3(d) are sectional views showing successive stages of a process for production of the photo-sensing device of the presnet invention.

In FIG. 3(a), a layer 111 of $Cd_{0.2}Se_{0.8}$ including 0.01 mol % of Cu is deposited 4000Å thick on a glass substrate 110 (Corning Co. Ltd, No. 7059,50×230×1.2 $mm^3$) using a vacuum evaporation method.

Figure 3B:
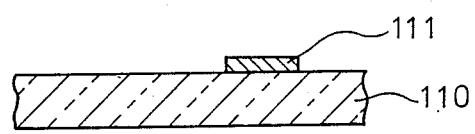

In FIG. 3(b), after a pattern is formed by a photoresist, an island-shaped $CdS_{0.2}Se_{0.8}$ layer 111 (90 $\mu m \times 350$ $\mu m$) is formed by a dry etching method. A plurality of such island-shaped $CdS_{0.2}Se_{0.8}$ layers 111, 111, . . . are disposed in a main scanning direction with a density of 8 bits/mm. The total number of island-shape $CdS_{0.2}Se_{0.8}$ layers 111, 111, . . . is 1728 bits.

Figure 3C:
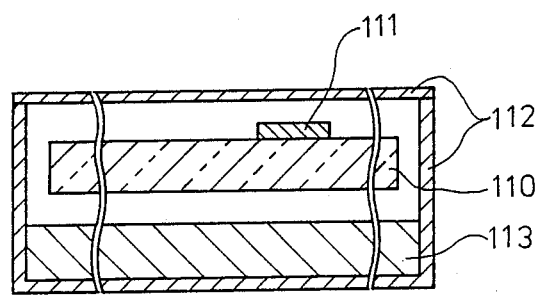

In FIG. 3(c), these island-shaped $CdS_{0.2}Se_{0.8}$ layers 111, 111, . . . are heated to activate the layer photo-electrically at 500° C. in an alumina boat 112 in which saturated vapor of $CdCl_2$ is filled. An activation powdered form of CdS containing 5% $CdCl_2$ 113 is a material for producing the vapor of $CdCl_2$.

Figure 3D:
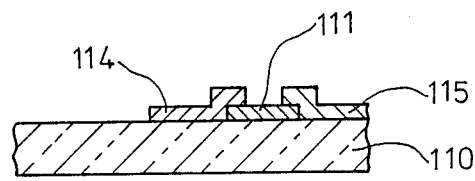

In FIG. 3(d), an electrode 114 and another electrode 115 are formed at opposite sides of the island-shaped $CdS_{0.2}Se_{0.8}$ layer 111 respectively. In the photo-sensing device of CdS-CdSe solid solution, an electric field is created by a voltage applied between both the electrodes 114 and 155. The intensity of the electric field saturates at a constant value, and hence a saturation voltage is approximately in proportion to the distance, i.e., the gap, between the electrodes, as is familiar to one skilled in the art. The gap of the opposite electrodes 114 and 115 is 60 μm. In the above-mentioned case, the saturation value of the electric field is known by those of ordinary skill in the art to be about $5 \times 10^3$ V/cm. Therefore, in the case of a 60 μm gap, the saturation voltage is 30 volts ($5 \times 10^3$ V/cm $\times 6 \times 10^{-3}$ cm=30).

In the present invention, since 60% or more of the saturation voltage is suitable to shorten the response time, the suitable value of the electric field is $3 \times 10^3$ V/cm or more ($0.6 \times 5 \times 10^3$ V/cm). A perspective view of the photo-sensing device after the forming of the electrodes 114 and 115, is shown in FIG. 4. As shown in FIG. 4, the 1728 bits of the island shaped $CdS_{0.2}Se_{0.8}$ layers 111 are grouped into one block by 32 bits. In the FIG. 4, the number of the layers 111 is abridged for explaining easily the present invention. A common electrode 114 is formed at one side of the island shaped $CdS_{0.2}Se_{0.8}$ layer 111 by every block as shown in FIG. 4. An individual electrode 115 is formed at the other side of the island shaped $CdS_{0.2}Se_{0.8}$ layer 111. A plural of individual electrodes 115, 115, . . . are bent by every block as shown in FIG. 4. An insulation sheet 116 is formed at the end parts of the grouped individual electrodes 115, 115, . . . as shown in FIG. 4. Further, a plural of metal stripe leads 117, 117, . . . are formed on the insulation sheets 116 in parallel as shown in FIG. 4. One piece of the metal stripe lead 117 is connected to an end part of one individual electrode 115 at a position Z between the insulation sheets 116, 116, . . . . And further, the metal stripe lead 117 is connected to one piece of the metal stripe lead 117 in other block as shown in FIG. 4.

With regard to one photo-sensing device 111, under such conditions that a DC voltage of 10 V is applied between the common electrode 114 and the individual electrode 115, and a green LED having a wavelength of 555 nm switches on and off by 1 Hz (the time between on and off is 0.5 sec), and the light intensity at the light receiving surface of the photo-sensing device 111 is 100 lux, a rise and fall characteristic of photocurrent to time is measured. The characteristic is shown by the curve 102 in FIG. 1. Further, when the biasing light is added, the characteristic is shown by the curve 103 in FIG. 1. Thus, even if the photo-sensing device 111 has an S-shape of the rise characteristic which is more moderate, the biasing light can give a steeper rise characteristic than that of the conventional photo-sensing device. A same LED as the LED of the above-mentioned main light is used as the biasing light source. The light intensity on the receiving surface of the photo-sensing device is 40 lux.

Figure 5:
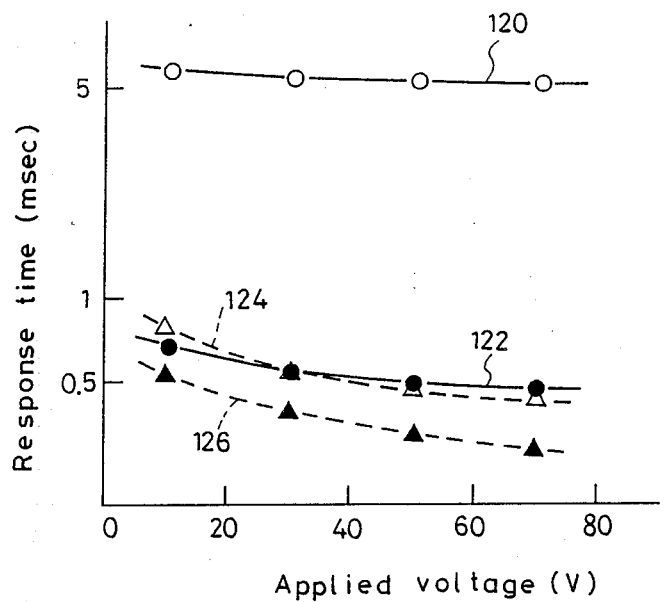
FIG. 5 is a diagram showing a characteristic of a photoresponse time to applied voltage, of the photo-sensing device of the present invention.

The response characteristic is shown in FIG. 5 when the biasing light is present or not, or the applied voltage is higher or lower.

The curve 120 indicates the characteristic of the rise time when the biasing light is not added and the curve 124 indicates the characteristic of the rise time when the biasing light is added. Incidentally in case of FIG. 5, the rise time is obtained by measuring from a time when the photocurrent is 0 to a time when the photocurrent is 50% of the saturated photocurrent value. The curve 122 indicates the characteristic of the fall time when the biasing light is not added and the curve 126 indicates the characteristic of the fall time when the biasing light is added.

As apparent from FIG. 5, at applied voltage of 10 V, the fall time do not vary largely by the biasing light, however the rise time becomes one seventh by the biasing light.

For comparing the above-mentioned characteristic of the photo-sensing device of the present invention with the characteristic of the conventional photo-sensing device, the rise and fall characteristics of the photocurrent to time are detected under the same conditions mentioned above with regard to the conventional photo-sensing device having a $CdS_{0.6}Se_{0.4}$ layer of 40 mol % CdSe including Cu. The result is shown in FIG. 6.

Figure 6:
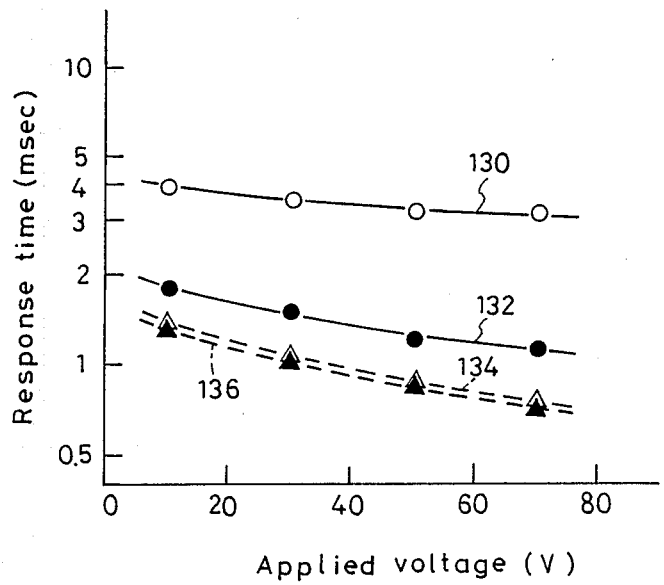
FIG. 6 is a diagram showing a characteristic of photoresponse time to applied voltage, of the conventional photo-sensing device.

In FIG. 6, the curve 130 indicates the characteristic of the rise time when the biasing light is not added and the curve 134 indicates the characteristic of the rise time when the biasing light is added. The curve 132 indicates the characteristic of the fall time when the biasing light is not added and the curve 136 indicates the characteristic of the fall time when the biasing light is added.

On comparing FIG. 6 and FIG. 5, when the biasing light is not added, the rise time of the conventional photo-sensing device is shorter than the rise time of the photo-sensing device of the present invention. However, when the biasing light is added, the rise time of the photo-sensing device of the present invention is shorter than the conventional one.

As apparent above, with regard to the conventional photo-sensing device having $CdS_{0.6}Se_{0.4}$ including Cu, the shortening effect of the rise time caused by the biasing light and the increase of the voltage is smaller than that of $CdS_{0.2}Se_{0.8}$ including Cu.

A composition rate of CdS-CdSe solid solution affects largely a curve shape of the response characteristic. That is, the variation of the response characteristic with the variation of the x in $CdS_{1-x}Se_x$, is as follows in FIG. 7. The curve 140 indicates a rise time $\tau r_{0-90}$ which is obtained by measuring from a time when the photocurrent is 0 to a time when the photocurrent is 90% of the saturated photocurrent value. The curve 141 indicates a fall time $\tau d_{100-10}$ which is obtained by measuring from a time when the photocurrent is 100% to a time when the light current is 10%. The curve 142 indicates a rise time $\tau r_{0-50}$ which is obtained by measuring from a time when the photocurrent is 0 to a time when the photocurrent is 50%. The curve 143 indicates a fall time $\tau d_{100-50}$ which is obtained by measuring from a time when the photocurrent is 100% to a time when the photocurrent is 50%. As apparent from FIG. 7, when the x is increased, that is, the amount of the CdSe is increased, the rise time $\tau r_{0-90}$, the fall time $\tau d_{100-10}$ and the fall time $\tau d_{100-50}$ are decreased but the rise time $\tau r_{0-50}$ is increased. The increase of the rise time $\tau r_{0-50}$ means that the response characteristic of the photocurrent to time shows a moderate rise characteristic at the beginning of the rise time when the x is large. That is, the shape of the curve of the response characteristic shows an S shape characteristic when the x is large.

Figure 7:
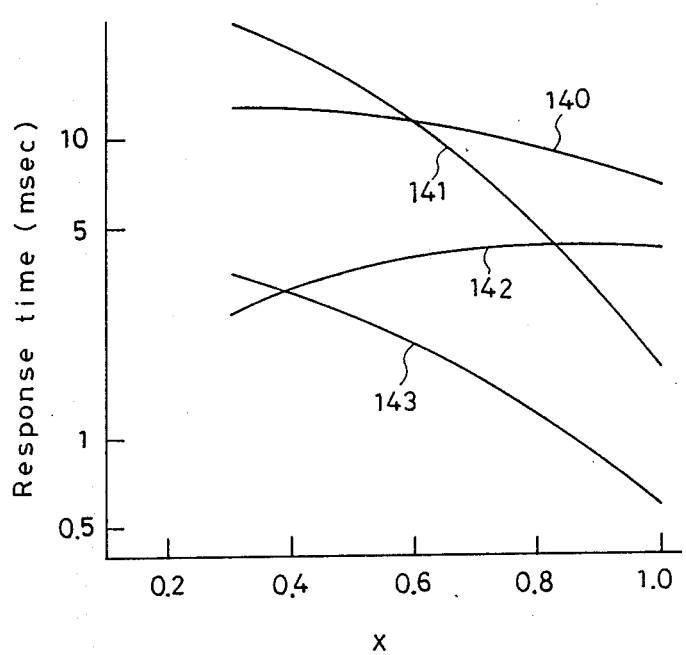
FIG. 7 is a diagram showing a characteristic of photoresponse time to amount of CdSe in CdS-CdSe solid solution.

In FIG. 7, the smaller $\tau r_{0-90}/\tau r_{0-50}$ becomes, the shape of the curve of the response characteristic gets near the S shape. When the x gets over 0.4, the shape of the curve of the response characteristic becomes S-shaped. A cause of such phenomenon is that the trap density in the CdS-CdSe is increased with the increase of the amount of the CdSe.

Figure 8:
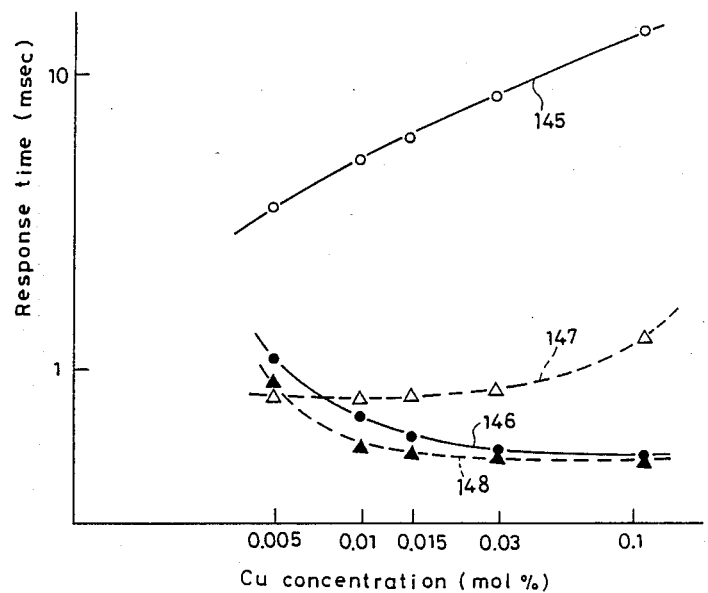
FIG. 8 is a diagram showing a characteristic of light response time to Cu concentration.

An amount of the added Cu affects the shape of the curve of the response characteristic. That is, the more the amount of the Cu becomes, the clearer the S shape of the curve becomes. FIG. 8 shows the variation of the response characteristic when the amount of the Cu added to the $CdS_{0.2}Se_{0.8}$ solid solution is changed. The variation of the response characteristic is obtained under such conditions that the main light is 100 lux, the biasing light is 40 lux and the applied voltage is 10 V. In FIG. 8, the curve 145 indicates a rise time $\tau r_{0-50}$ from a time of 0% to a time of 50% without the biasing light. The curve 146 indicates a fall time $\tau d_{100-50}$ from a time of 100% to a time of 50% without the biasing light. The curve 147 indicates a rise time $\tau r_{0-50}$ from a time of 0 to a time of 50% with the biasing light. The curve 148 indicates a fall time $\tau d_{100-50}$ from a time of 100% to a time of 50% with the biasing light. As apparent from the FIG. 8, the rise time $\tau r_{0-50}$ with the biasing light is increased largely when the concentration of Cu is 0.03 mol % or more. The fall time $\tau d_{0-50}$ with the biasing light is increased greatly when the concentration of Cu is 0.01 mol % or less. Therefore, the preferable concentration of the Cu is 0.01 mol % or more, and 0.03 mol % or less since the fall time is also significant factor for the characteristic of the photo-sensing device. Incidentally, the reason as to why the preferable amount of the Cu is determined with considering the 50% of the saturated photocurrent, is as follows. That is, when the manuscript is read with binary values for white and black, each value of 65% or more of the saturated photocurrent is considered as white and each value of 65 or less is considered as black. However, it is confirmed that the use of 50% as criteria, which is easy to be measured does not make any inconvenience. In the case of the photo-sensing device of 1728 bits for A4 sheet size, when the manuscript is read with the binary value of white and black by 5 msec/line, it is confirmed that the rise time $\tau r_{0-50}$ and the fall time $\tau d_{100-50}$ which are within 3 msec are available. And for realizing the scanning velocity of 1 msec/line, the rise time $\tau r_{0-50}$ and the fall time $\tau d_{100-50}$ should be 0.6 msec or less. Generally, the rise time $\tau r_{0-50}$ is larger than the fall time $\tau d_{100-50}$ and therefore the rise time $\tau r_{0-50}$ is a barrier to the improvement of the scanning velocity. The present invention intends to improve particularly the rise time $\tau r_{0-50}$.

Figure 9:
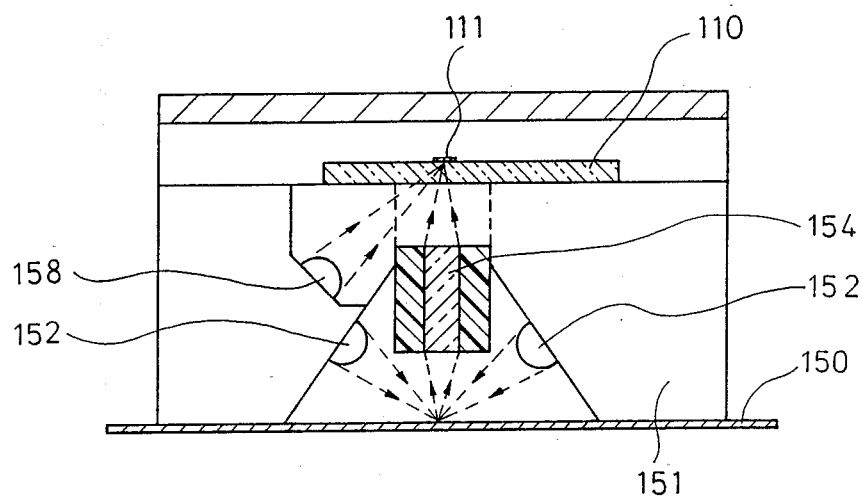
FIG. 9 is a sectional view showing an image reading apparatus of the present invention.

In FIG. 9, an image sensing apparatus utilizing the above-mentioned photo-sensing device is disclosed. The image sensing apparatus has a circuit which cancels the biasing current component in the detected photocurrent. In FIG. 9, the manuscript 150 is disposed under the image sensing apparatus. The main light sources 152, 152 are fixed to a main frame 151 of the image sensing apparatus. A rod lens 154 is disposed above the manuscript 150 and focuses the light which is reflected onto the manuscript 150. The manuscript 150 is irradiated by the light from the main light source 152, 152. Above the rod lens 154, the glass substrate 110 having the photo-sensing device 111 is disposed. The reflected light is focused to the photo-sensing device 111. Further, the biasing light source 158 is also fixed to the main frame 151. The biasing light is irradiated directly onto the photo-sensing device 111 as shown in FIG. 9.

Incidentally, as another embodiment, a function of the main light source and a function of the biasing light source are performed by a light source.

The image sensing apparatus of the present invention can read a manuscript with a high speed which is seven times greater than the conventional speed.

While specific embodiments of the invention have been illustrated and described herein, it is realized that modifications and changes will occur to those skilled in the art. It is therefore to be understood that the appended claims are intended to cover all modifications and changes as fall within the true spirit and scope of the invention.

We claim:

1. A photo-sensing device for detecting light signals under application of a biasing light comprising:
   a photo-electric transducing element of a material having a given response characteristic of photocurrent to time, namely a rise characteristic which is S-shaped;
   said material of said photo-sensing device being a II–VI compound semiconductor made of a CdS-CdSe solid solution including at least 40 mol percent CdSe and having a Cu material added thereto;
   said Cu material constituting 0.01 mol % or more and 0.03 mol % or less of said material of said photo-sensing device;
   said photocurrent being detected from said photo-sensing device irradiated by a main light which is adapted to be reflected onto a manuscript and to be further irradiated directly by a biasing light; and
   the intensity of said biasing light being 1/100 to 1 of the intensity of said main light.

2. A photo-sensing device comprising:
   a II–VI compound semiconductor having a response characteristic of a photocurrent to a time, namely, a rise characteristic which is S-shaped, and
   said photocurrent being detected from said photo-sensing device irradiated by a main light which is adapted to be reflected onto a manuscript and to be further irradiated directly by a biasing light;
   the intensity of said biasing light being 1/100 to 1 of the intensity of said main light.

3. A photo-sensing device for detecting light signals under application of a biasing light comprising:
   a photo-electric transducing element of a material having a given response characteristic of photocurrent to time, namely a rise characteristic which is S-shaped;
   said material of said photo-sensing device being a II–VI compound semiconductor made of a CdS-CdSe solid solution including at least 40 mol percent CdSe and having a Cu material added thereto;
   said Cu material constituting 0.01 mol % or more and 0.03% or less of said material of said photo-sensing device; and
   said photo-sensing device being applied between two electrodes thereof with a voltage of at least 60% of a saturating voltage for said photocurrent, for creating an electric field of at least $3 \times 10^3$ V/cm between said electrodes.

4. A photo-sensing device comprising:
   a II–VI compound semiconductor having a response characteristic of a photocurrent to time, namely, a rise characteristic which is S-shaped, and
   said photocurrent being detected from said photo-sensing device irradiated by a main light which is adapted to be reflected onto a manuscript and to be further irradiated directly by a biasing light;

said II–VI compound semiconductor being made of a CdS-CdSe solid solution including at least 40 mol % CdSe and having a Cu material added thereto;
said Cu material being present in an amount in the range between 0.01 mol % and 0.03 mol %; and
the intensity of said biasing light being 1/100 to 1 of the intensity of said main light.

5. A photo-sensing device comprising:
a II–VI compound semiconductor having a response characteristic of a photocurrent to time, namely, a rise characteristic which is S-shaped, and
said photocurrent being detected from said photo-sensing device irradiated by a main light which is adapted to be reflected onto a manuscript and to be further irradiated directly by a biasing light;
the intensity of said biasing light is 5/100 to 1 of the intensity of said main light.

6. A photo-sensing device comprising:
a II–VI compound semiconductor having a response characteristic of a photocurrent to time, namely, a rise characteristic which is S-shaped;
said photocurrent being detected from said photo-sensing device irradiated by a main light which is adapted to be reflected onto a manuscript and to be further irradiated directly by a biasing light;
said II–VI compound semiconductor being made of a CdS-CdSe solid solution including at least 40 mol % CdSe and having a Cu material added thereto; and
said photo-sensing device being applied between two electrodes thereof with a voltage of at least 60% of a saturating voltage for said photocurrent, for creating an electric field of at least $3 \times 10^3$ V/cm between said electrodes.

* * * * *

UNITED STATES PATENT AND TRADEMARK OFFICE
CERTIFICATE OF CORRECTION

PATENT NO. : 4,920,394

DATED : April 24, 1990

INVENTOR(S) : Noboru Yukami; Mitsusuke Ikeda, Masaharu Ohno; Mikihiko Nishitani

It is certified that error appears in the above-identified patent and that said Letters Patent is hereby corrected as shown below:

Title Page

[75] Fourth inventor's name should read -- Mikihiko Nishitani --

[73] City of Assignee should read -- Kadoma --

Signed and Sealed this

Third Day of September, 1991

Attest:

HARRY F. MANBECK, JR.

Attesting Officer

Commissioner of Patents and Trademarks